(12) United States Patent
Tanaka

(10) Patent No.: US 11,583,935 B2
(45) Date of Patent: Feb. 21, 2023

(54) COATED CUTTING TOOL

(71) Applicant: TUNGALOY CORPORATION, Fukushima (JP)

(72) Inventor: Shigeki Tanaka, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 639 days.

(21) Appl. No.: 15/560,440

(22) PCT Filed: Mar. 25, 2016

(86) PCT No.: PCT/JP2016/059545
§ 371 (c)(1),
(2) Date: Sep. 21, 2017

(87) PCT Pub. No.: WO2016/158717
PCT Pub. Date: Oct. 6, 2016

(65) Prior Publication Data
US 2018/0071831 A1    Mar. 15, 2018

(30) Foreign Application Priority Data
Mar. 27, 2015   (JP) .............................. JP2015-066976

(51) Int. Cl.
| | |
|---|---|
| *B23B 27/14* | (2006.01) |
| *C23C 30/00* | (2006.01) |
| *C23C 28/04* | (2006.01) |
| *C23C 14/02* | (2006.01) |
| *B23B 51/00* | (2006.01) |
| *B23C 5/16* | (2006.01) |
| *C23C 14/06* | (2006.01) |

(52) U.S. Cl.
CPC ........... *B23B 27/148* (2013.01); *B23B 51/00* (2013.01); *B23C 5/16* (2013.01); *C23C 14/024* (2013.01); *C23C 14/0641* (2013.01); *C23C 28/044* (2013.01); *C23C 30/005* (2013.01); *B23B 2228/105* (2013.01); *B23C 2228/10* (2013.01)

(58) Field of Classification Search
None
See application file for complete search history.

(56) References Cited

U.S. PATENT DOCUMENTS

| | | | | |
|---|---|---|---|---|
| 5,981,049 A | * | 11/1999 | Ohara | ................. C23C 14/0641 51/295 |
| 2002/0168552 A1 | * | 11/2002 | Yamamoto | .......... C23C 14/0641 428/697 |
| 2009/0274899 A1 | | 11/2009 | Sundstrom et al. | |
| 2012/0201615 A1 | * | 8/2012 | Ni | ....................... C23C 14/0641 407/30 |
| 2014/0193623 A1 | | 7/2014 | Setoyama et al. | |
| 2015/0050490 A1 | | 2/2015 | Kumar et al. | |

FOREIGN PATENT DOCUMENTS

| | | | |
|---|---|---|---|
| JP | H10-330914 A | | 12/1998 |
| JP | H110140647 A | | 5/1999 |
| JP | 2003-260603 A | * | 9/2003 |
| JP | 2009-090452 A | | 4/2009 |
| JP | 2015036189 A | | 2/2015 |
| JP | 2015110256 A | * | 6/2015 |

OTHER PUBLICATIONS

International Search Report issued in PCT/JP2016/059545; dated Jun. 14, 2016.
International Preliminary Report on Patentability and Written Opinion issued in PCT/JP2016/059545 dated Oct. 3, 2017.

* cited by examiner

*Primary Examiner* — Pegah Parvini
*Assistant Examiner* — Ross J Christie
(74) *Attorney, Agent, or Firm* — Studebaker & Brackett PC

(57) ABSTRACT

A coated cutting tool is provided which allows for satisfactory machining over a long period of time, particularly in the machining of difficult-to-machine materials with low thermal conductivity. The coated cutting tool includes a substrate and a coating layer formed on a surface of the substrate, wherein: at least one layer of the coating layer comprises a predetermined layer containing a compound having a composition represented by the formula: $(Al_x Ti_{1-x})N$ [wherein x denotes an atomic ratio of the Al element based on a total of the Al element and the Ti element, and x satisfies $0.60 \leq x \leq 0.85$]; a value of an orientation index TC (311) of a cubic (311) plane of the predetermined layer is from 2.5 or more to 4.2 or less; and an average thickness of the predetermined layer is from 1.0 μm or more to 12.0 μm or less.

20 Claims, No Drawings

COATED CUTTING TOOL

TECHNICAL FIELD

The present invention relates to a coated cutting tool.

BACKGROUND ART

In recent years, a cutting tool having a longer tool life than in the case of a conventional cutting tool has been required, along with an increasing demand for highly efficient cutting. Thus, in terms of the characteristics required for tool materials, improvements of wear resistance and fracture resistance, which are related to the life of a cutting tool, have been becoming increasingly important. In view of this, in order to improve such characteristics, a coated cutting tool is widely used which includes: a substrate comprised of a cemented carbide, cermet, cBN or the like; and a coating layer covering a surface of the substrate, the coating layer consisting of one layer or two or more layers which is/are each comprised of a TiN layer, a TiAlN layer or the like.

Various techniques have been proposed in order to improve the above characteristics of a coating layer. For example, Patent Document 1 proposes a coated cutting tool including two layers, each of which consists of a single layer of one kind selected from among a nitride of Ti and Al, a carbonitride thereof, a carbonate thereof and a carboxynitride thereof, or multiple layers of two or more kinds selected therefrom, wherein the two layers are: a first layer having a maximum peak intensity for a (200) crystal plane and a second layer having a maximum peak intensity for a (111) crystal plane.

Patent Document 2 proposes a coated cutting tool including a coating layer in which a composite nitride represented by the composition formula of $(Ti_xAl_{1-x})N$ (x: 0.25 to 0.50 in the atomic ratio) has preferential orientation of a (200) plane.

As disclosed in Patent Documents 1 and 2, in a compound layer of Ti and Al, it is known that diffraction intensities in X-ray diffraction are controlled so that the characteristics of a coating layer are controlled. It is particularly known that peeling-off resistance and oxidation resistance are improved by performing control so as to achieve preferential orientation of a (111) plane and that wear resistance is improved by performing control so as to achieve preferential orientation of a (200) plane.

CITATION LIST

Patent Documents

Patent Document 1: JPH10-330914 A
Patent Document 2: JP2009-090452 A

SUMMARY

Technical Problem

While there has been a trend in which cutting conditions are severe, compared with the prior art, in order to increase machining efficiency, a longer tool life than so far has been demanded. However, in the machining of difficult-to-machine materials with low thermal conductivity, such as a nickel-based heat-resistant alloy and a cobalt-based heat-resistant alloy, a coating included in a cutting edge is prone to be decomposed and oxidized due to the generation of heat during cutting. Therefore, the reduction in hardness of such coating and the embrittlement thereof tend to invite the occurrence of fractures in the tool.

With such background, in the above-described conventional coated cutting tool, the oxidation resistance and mechanical strength of the coating are required to be further improved so that the tool life is further extended.

The present invention has been made in light of the above circumstances, and an object of the present invention is to provide a coated cutting tool which allows for satisfactory machining over a long period of time, particularly in the machining of difficult-to-machine materials with low thermal conductivity.

Solution to Problem

The present inventor has conducted studies regarding the extension of the tool life of a coated cutting tool and has then found that the following configurations of a coated cutting tool allow the fracture resistance thereof to be improved, and found that, as a result, the tool life of the coated cutting tool can be extended, and this has led to the completion of the present invention.

Namely, the gist of the present invention is as set forth below.

(1) A coated cutting tool comprising a substrate and a coating layer formed on a surface of the substrate, wherein:
at least one layer of the coating layer comprises a predetermined layer containing a compound having a composition represented by the formula:

$$(Al_xTi_{1-x})N$$

[wherein x denotes an atomic ratio of the Al element based on a total of the Al element and the Ti element, and x satisfies $0.60 \leq x \leq 0.85$];
a value of an orientation index TC (311) of a cubic (311) plane of the predetermined layer is from 2.5 or more to 4.2 or less; and
an average thickness of the predetermined layer is from 1.0 μm or more to 12.0 μm or less.

(2) The coated cutting tool of (1), wherein a value of an orientation index TC (111) of a cubic (111) plane of the predetermined layer is from 0.85 or more to 1.5 or less.

(3) The coated cutting tool of (1) or (2), wherein the predetermined layer has a compressive stress of 0.2 GPa or higher to 6.0 GPa or lower.

(4) The coated cutting tool of any of (1) to (3), wherein:
the coating layer comprises, between the predetermined layer and the substrate, a lower layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B (the lower layer having a composition different from that of the predetermined layer); and
an average thickness of the lower layer is from 0.1 μm or more to 3.5 μm or less.

(5) The coated cutting tool of any of (1) to (4), wherein:
the coating layer comprises, on a side of the predetermined layer which is opposite to the substrate, an upper layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B (the upper layer having a composition different from that of the predetermined layer); and
an average thickness of the upper layer is from 0.1 μm or more to 3.5 μm or less.

(6) The coated cutting tool of any of (1) to (5), wherein an average thickness of the coating layer in its entirety is from 1.0 μm or more to 15.0 μm or less.

(7) The coated cutting tool of any of (1) to (6), wherein the coating layer is formed by a physical vapor deposition method.

(8) The coated cutting tool of any of (1) to (7), wherein the substrate is comprised of a cemented carbide, cermet, ceramics or a sintered body containing cubic boron nitride.

Advantageous Effects of Invention

The present invention can provide a coated cutting tool which allows for satisfactory machining over a long period of time, particularly in the machining of difficult-to-machine materials with low thermal conductivity.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

A coated cutting tool according to the present embodiment includes a substrate and a coating layer formed on a surface of the substrate. The substrate in the present embodiment is not particularly limited, as long as it may be used as a substrate for the coated cutting tool. Examples of the substrate include a cemented carbide, cermet, ceramic, a sintered body containing cubic boron nitride, a diamond sintered body and high-speed steel. From among the above examples, the substrate is further preferably comprised of at least one kind selected from the group consisting of a cemented carbide, cermet, ceramics and a sintered body containing cubic boron nitride because further excellent wear resistance and fracture resistance can be provided. Such substrate examples are used either singly or as a combination of two or more thereof.

The coated cutting tool of the present embodiment shows the tendency of wear resistance being further improved if the average thickness of the entire coating layer is 1.0 μm or more. Meanwhile, such coated cutting tool shows the tendency of fracture resistance being further improved if the average thickness of the entire coating layer is 15.0 μm or less. Thus, the average thickness of the entire coating layer is preferably from 1.0 μm or more to 15.0 μm or less. In particular, from the same perspective as that set forth above, the average thickness of the entire coating layer is more preferably from 2.0 μm or more to 10.0 μm or less.

The coating layer of the present embodiment may consist of one layer or multiple layers of two or more layers. However, at least one layer of the coating layer must include a specific layer described below (hereinafter referred to as a "hard layer"). The hard layer according to the present embodiment contains a compound having the composition represented by the formula below:

$(Al_xTi_{1-x})N$.

Thus, such hard layer is excellent in terms of oxidation resistance. The compound having the composition represented by the formula in the hard layer of the present embodiment preferably contains cubic crystals, or contains cubic crystals and hexagonal crystals. In the formula, x denotes an atomic ratio of the Al element based on a total of the Al element and the Ti element, and x satisfies 0.60≤x≤0.85. If the atomic ratio x of the Al element is 0.60 or more, this leads to a large content of Al, thereby allowing the reduction in oxidation resistance to be further suppressed, whereas, if the atomic ratio x of the Al element is 0.85 or less, this leads to a further reduced existence ratio of hexagonal crystals, thereby allowing the reduction in wear resistance to be further suppressed. In particular, x is preferably from 0.60 or more to 0.80 or less because a more excellent balance is achieved between oxidation resistance and wear resistance, and x is more preferably from 0.65 or more to 0.80 or less.

In the present embodiment, when the composition of the hard layer is represented by $(Al_{0.6}Ti_{0.4})N$, such representation indicates that the atomic ratio of the Al element based on a total of the Al element and the Ti element is 0.6 and that the atomic ratio of the Ti element based on a total of the Al element and the Ti element is 0.4. That is, such representation indicates that the amount of the Al element based on a total of the Al element and the Ti element is 60 atom % and that the amount of the Ti element based on a total of the Al element and the Ti element is 40 atom %.

In the present embodiment, if the average thickness of the hard layer is 1.0 μm or more, this allows the reduction in wear resistance to be further suppressed, and if such thickness is 12.0 μm or less, this allows the reduction in fracture resistance to be further suppressed. Thus, the average thickness of the hard layer is from 1.0 μm or more to 12.0 μm or less. In particular, from the same perspective as that set forth above, the average thickness of the hard layer is preferably from 1.0 μm or more to 10.0 μm or less, and is more preferably from 2.0 μm or more to 8.0 μm or less.

The coating layer of the present embodiment may be comprised of the hard layer alone. However, it is preferable for a lower layer to be provided between the substrate and the hard layer (i.e., located as a layer below the hard layer) because the adhesion between the substrate and the hard layer is further improved. In particular, the lower layer, from the same perspective as that set forth above, preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B, more preferably contains a compound of: an element of at least one kind selected from the group consisting of Ti, Zr, Nb, Cr, Mo, W, Al, Si and Y; and an element of at least one kind selected from the group consisting of C, N, O and B, and further preferably contains a compound of: an element of at least one kind selected from the group consisting of Ti, Zr, Nb, Cr, Mo, W, Al, Si and Y; and N. It should be noted, however, that the lower layer is different from the hard layer in terms of their respective compositions. Further, the lower layer may be comprised of a single layer or multiple layers of two or more layers.

In the present embodiment, the average thickness of the lower layer is preferably from 0.1 μm or more to 3.5 μm or less because this indicates the tendency of the adhesion between the substrate and the coating layer being further improved. From the same perspective, the average thickness of the lower layer is more preferably from 0.3 μm or more to 3.0 μm or less, and is further preferably from 0.5 μm or more to 3.0 μm or less.

The coating layer of the present embodiment may have an upper layer on a side of the hard layer which is opposite to the substrate (i.e., an upper layer located as a layer on the hard layer), preferably on a surface of the hard layer. The upper layer further preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B because further excellent wear resistance is achieved. Further, from the same perspective as that set forth above, the upper layer more preferably contains a compound of: an element of at least one kind selected from the group consisting of Ti, Hg, V, Ta, Cr and Al; and an element of at least one kind selected from the group consisting of C, N, O and B, and further preferably contains a compound of: an element of at least one kind selected from the group consisting of Ti, Hf, V, Ta, Cr and Al; and N. It should be noted, however, that the upper layer is different from the hard layer in terms of their respective compositions. Further, the upper layer may be comprised of a single layer or multiple layers of two or more layers.

In the present embodiment, the average thickness of the upper layer is preferably from 0.1 µm or more to 3.5 µm or less because this indicates the tendency of wear resistance being excellent. From the same perspective, the average thickness of the upper layer is more preferably from 0.2 µm or more to 2.0 µm or less, and is further preferably from 0.3 µm or more to 1.0 µm or less.

In the hard layer of the coated cutting tool of the present embodiment, if the value of an orientation index TC (311) of a cubic (311) plane is from 2.5 or more to 4.2 or less, the mechanical strength of the hard layer is high, resulting in a coated cutting tool which is excellent in terms of fracture resistance. From the same perspective, the value of the orientation index TC (311) is preferably from 2.5 or more to 4.0 or less, more preferably from 2.5 or more to 3.8 or less, and further preferably from 2.6 or more to 3.6 or less.

In the hard layer of the coated cutting tool of the present embodiment, if the value of an orientation index TC (111) of a cubic (111) plane is 0.85 or more, this allows the reduction in size of the tissues of the hard layer to be suppressed, leading to the tendency of allowing the wear resistance to be kept high. Meanwhile, if the value of TC (111) is 1.5 or less, the value of TC (311) is relatively high, leading to the tendency of allowing the reduction in mechanical strength to be further suppressed. Therefore, in the present embodiment, the value of the orientation index TC (111) of the cubic (111) plane in the hard layer is preferably from 0.85 or more to 1.5 or less, and more preferably from 0.85 or more to 1.3 or less.

The orientation index TC (311) of the cubic (311) plane and the orientation index TC (111) of the cubic (111) plane in the present embodiment are respectively defined by the following formulae when the peak intensity value of X-ray diffraction which is obtained from an (hkl) plane when X-ray diffraction is performed on the hard layer ((Al, Ti)N layer) is regarded as l (hkl), and also when the standard diffraction intensity of an (hkl) plane which is indicated on the ICDD card, No. 00-046-1200 is regarded as $I_0$(hkl). Herein, (hkl) refers to five planes, i.e., (111), (200), (220), (311) and (222).

$$TC(311) = \frac{I(311)}{I_0(311)} \left\{ \frac{1}{5} \sum \frac{I(hkl)}{I_0(hkl)} \right\}^{-1} \quad \text{[Formula 1]}$$

$$TC(111) = \frac{I(111)}{I_0(111)} \left\{ \frac{1}{5} \sum \frac{I(hkl)}{I_0(hkl)} \right\}^{-1} \quad \text{[Formula 2]}$$

As to the peak intensity of each plane index in the hard layer of the present embodiment, such peak intensity can be measured using a commercially available X-ray diffractometer. For instance, when performing, by means of an X-ray diffractometer, RINT TTR III (product name) manufactured by Rigaku Corporation, an X-ray diffraction measurement by means of a 2θ/θ focusing optical system with Cu-Kα radiation under the following conditions, the above peak intensity of each plane index can be measured. Herein, the measurement conditions are as set forth below: an output: 50 kV, 250 mA; an incident-side solar slit: 5°; a divergence longitudinal slit: 2/3°; a divergence longitudinal limit slit: 5 mm; a scattering slit: 2/3°; a light-receiving side solar slit: 5°; a light-receiving slit: 0.3 mm; a BENT monochromator; a light-receiving monochrome slit: 0.8 mm; a sampling width: 0.01°, a scan speed: 4°/min, and a 2θ measurement range: 20-140°. When obtaining the above peak intensity of each plane index from an X-ray diffraction pattern, analytic software included with the X-ray diffractometer may be used. With such analytic software, background processing and Kα2 peak removal are conducted using cubic spline, and profile fitting is conducted using Pearson-VII function, whereby each peak intensity can be obtained. It should be noted that, when the lower layer is formed so as to be closer to the substrate than the hard layer, each peak intensity can be measured by thin-film X-ray diffraction method in order to avoid the influence of the lower layer.

It is preferable for the hard layer of the present embodiment to be provided because, when it has compressive stress, the mechanical strength is improved, thereby leading to the coated cutting tool having improved fracture resistance. In particular, if the compressive stress of the hard layer is 0.2 GPa or higher, this indicates the tendency of the fracture resistance being improved, and, if the compressive stress of the hard layer is 6.0 GPa or lower, this leads to the tendency of allowing the peeling-off of the coating layer to be further suppressed. Therefore, the compressive stress of the hard layer is preferably from 0.2 GPa or higher to 6.0 GPa or lower, more preferably from 1.0 GPa or higher to 5.5 GPa or lower, and further preferably from 2.0 GPa or higher to 5.0 GPa or lower.

The above compressive stress can be measured by a $\sin^2\varphi$ method using an X-ray diffractometer. Such compressive stress can be measured by: measuring, via the $\sin^2\varphi$ method, the stresses at any ten points included in a portion involved in cutting (these points are preferably selected in such a way as to be apart from one another at 0.5 mm or more distances so as to represent the stress of the above portion); and obtaining the average value. As to an intercept (undistorted angle), a numerical value to be used is calculated in accordance with the composition ratio, using the diffraction angles indicated on the ICDD cards No. 00-006-0642 and No. 00-046-1200 (corresponding, respectively, to cubic TiN and cubic AlN).

Specifically, when the composition of the hard layer is $(Al_aTi_{1-a})N$, the undistorted angle (2θ) of the cubic (111) plane can be calculated from the following equation.

Undistorted angle(2θ)=$T_{2\theta}$+(Aa)·($A_{2\theta}$−$T_{2\theta}$)

Herein, in the equation, $T_{2\theta}$ denotes the diffraction angle (36.81°) of the (111) plane of cubic TiN, $A_{2\theta}$ denotes the diffraction angle (38.53°) of the (111) plane of cubic AlN, and Aa denotes an atomic ratio (a) of the Al element based on a total of the Al element and the Ti element.

Therefore, when the composition of the hard layer is $(Al_{0.7}Ti_{0.3})N$, the undistorted angle (2θ) of the cubic (111) plane is 38.01°.

A method of manufacturing a coating layer in a coated cutting tool according to the present embodiment is not particularly limited. However, examples of such method include physical vapor deposition methods, such as an ion plating method, an arc ion plating method, a sputtering method and an ion mixing method. The coating layer is preferably formed by a physical vapor deposition method because sharp edges can be formed. In particular, the arc ion plating method is more preferable because further excellent adhesion is achieved between the coating layer and the substrate.

A method of manufacturing a coated cutting tool according to the present embodiment will now be described using specific examples. It should be noted that the method of manufacturing a coated cutting tool according to the present embodiment is not particularly limited, as long as the configurations of the coated cutting tool may be achieved.

Firstly, a substrate processed in a tool shape is received in a reaction vessel of a physical vapor deposition apparatus, and metal evaporation sources are placed in the reaction vessel. Thereafter, the reaction vessel is evacuated until the pressure therein becomes $1.0 \times 10^{-2}$ Pa or lower, and the substrate is heated, by a heater in the reaction vessel, until the temperature becomes 600° C. or higher to 700° C. or lower. After the heating, an Ar gas is introduced into the reaction vessel so that the pressure in the reaction vessel is 0.5 Pa or higher to 5.0 Pa or lower. In the Ar gas atmosphere with a pressure of 0.5 Pa or higher to 5.0 Pa or lower, a bias voltage of −350V or higher to −500V or lower is applied to the substrate, a current of 40 A or higher to 50 A or lower is caused to flow through a tungsten filament in the reaction vessel, whereby an ion bombardment process is carried out, with the Ar gas, on a surface of the substrate. After the ion bombardment process is carried out on the substrate surface, the reaction vessel is evacuated such that the pressure therein indicates a vacuum of $1.0 \times 10^{-2}$ Pa.

Then, the substrate is heated so as to have a temperature of 400° C. or higher to 700° C. or lower, a nitrogen gas ($N_2$) is introduced in the reaction vessel, and the pressure in the reaction vessel is set at from 0.5 Pa or higher to 5.0 Pa or lower. Thereafter, a bias voltage of −10V or higher to −80V or lower is applied to the substrate, and a metal evaporation source according to the metal components of each layer is evaporated via an arc discharge of 100 A or higher to 150 A or lower, whereby the formation of particles of a hard layer on the surface of the substrate or on the surface of the lower layer is started. After the start of the particle formation, particles are formed while varying the temperature of the substrate to reach a low temperature (particle formation step). When particles are formed while varying the temperature of the substrate to reach a low temperature, the particle formation rate is slow. By rapidly slowing the particle formation rate, particles of a more uniform diameter and a more uniform shape can be formed. Particles of a more uniform diameter and a more uniform shape are preferably formed because this allows for the value of TC (311) to be increased. More specifically, the cooling rate for the substrate temperature is preferably set at 80° C./hour or more.

After the particle formation step, the substrate is heated so as to have a temperature of 400° C. or higher to 700° C. or lower, a bias voltage of −50 V or higher to −150 V or lower is applied to the substrate, and the metal evaporation source according to the metal components of each layer is evaporated via an arc discharge of 100 A or higher to 150 A or lower, whereby a hard layer is deposited. After the start of the deposition, a hard layer is formed while varying the temperature of the substrate to reach a low temperature (deposition step). When a hard layer is formed while varying the temperature of the substrate to reach a low temperature, the hard-layer formation rate is slow. When the cooling rate for the substrate temperature is set at 20° C./hour or more, desired orientation will be more prone to be obtained. Meanwhile, when the cooling rate for the substrate temperature is set at 50° C./hour or less, the time during which a hard layer is substantially deposited becomes longer, resulting in a hard layer with a further increased thickness. Therefore, the cooling rate for the substrate temperature is preferably set at from 20° C./hour or more to 50° C./hour or less.

In order to increase the value of the orientation index TC (311) of the cubic (311) plane in the hard layer of the present embodiment, it is preferable to carry out: a particle formation step which involves the formation of particles comprised of a nitride in which the atomic ratio of the Al element based on a total of the Al element and the Ti element of the metal evaporation source is from 0.60 or more to 0.85 or less; and a deposition step in which a hard layer is formed over the formed particles. In the deposition step, the hard-layer deposition rate is gradually slowed down, whereby the value of TC (311) can be increased. The temperature of the substrate greatly affects the hard-layer deposition rate. When the above manufacturing conditions are combined so that the deposition rate is gradually slowed down to within a range of 0.3 μm or more to 2.5 μm or less per hour, the hard layer of the present embodiment will be prone to be obtained. A lower deposition rate per hour leads to an increased value of TC (311). Further, it is also preferable to use a metal evaporation source which involves a high atomic ratio of the Al element based on a total of the Al element and the Ti element, because the value of TC (311) can be increased.

In the hard layer of the present embodiment, in order to set the orientation index TC (311) of the cubic (311) plane at from 2.5 or more to 4.2 or less and to increase the value of the orientation index TC (111) of the cubic (111) plane, the deposition rate may be set at from 1.0 μm or more to 1.7 μm or less per hour. If the deposition rate is 1.0 μm or more per hour, excessively preferential orientation of the cubic (311) plane can be further suppressed. Meanwhile, if the deposition rate is 1.7 μm or less per hour, preferential orientation of the (200) plane or (220) plane can be further suppressed, whereby the value of TC (111) can be kept higher.

In order to apply a predetermined compressive stress to the hard layer of the present embodiment, a bias voltage to be applied to the substrate may have a great absolute value in the above deposition step. More specifically, comparing the case of a bias voltage of −50 V and the case of a bias voltage of −100 V, the absolute value of the bias voltage of −100 V is larger, leading to a large compressive stress to be applied to the hard layer. Further, when using a metal evaporation source which has a low atomic ratio of the Al element based on a total of the Al element and the Ti element, this indicates the tendency of the compressive stress of the hard layer being increased. Accordingly, the compressive stress can be controlled by adjusting the bias voltage and the composition of the metal evaporation source.

The thickness of each layer which constitutes the coating layer in the coated cutting tool of the present embodiment can be measured from a cross-sectional structure of the coated cutting tool, using an optical microscope, a scanning electron microscope (SEM), a transmission electron microscope (TEM), or the like. It should be noted that, as to the average thickness of each layer in the coated cutting tool of the present embodiment, such average thickness can be obtained by: measuring the thickness of each layer, from each of the cross-sectional surfaces at three or more locations near the position 50 μm off from the edge of a surface facing the metal evaporation source, toward the center of such surface; and calculating the average value (arithmetic mean) of the resulting measurements.

The composition of each layer which constitutes the coating layer in the coated cutting tool of the present embodiment can be measured from a cross-sectional structure of the coated cutting tool of the present embodiment, using an energy-dispersive X-ray spectroscope (EDS), a wavelength-dispersive X-ray spectroscope (WDS), or the like.

The coated cutting tool of the present embodiment can be considered to provide the effect of being capable of extending the tool life compared with the prior art due to the major point of having excellent oxidation resistance and mechanical strength (it should be noted, however, that the factor of such extension of tool life is not limited thereto). Specific examples of types of the coated cutting tool of the present embodiment include an indexable cutting insert for milling or turning, a drill, an end mill, etc.

EXAMPLES

Although the present invention will be described in further detail below, with examples, the present invention is not limited to such examples.

A machined cemented carbide insert with a shape of ISO certified CNMG120408 and a composition of 93.2WC-6.500-0.3$Cr_3C_2$ (mass %) was prepared as a substrate. In a reaction vessel of an arc ion plating apparatus, a metal evaporation source was arranged so as to achieve the composition of each layer shown in Tables 1 and 2. The prepared substrate was fixed to a fixation fitting of a rotating table in the reaction vessel.

Thereafter, the reaction vessel was evacuated such that the pressure therein indicated a vacuum of $5.0 \times 10^{-3}$ Pa or less. After the evacuation, the substrate was heated by a heater in the reaction vessel so as to have a temperature of 600° C. After the heating, an Ar gas was introduced into the reaction vessel such that the pressure therein was 5.0 Pa.

In the Ar gas atmosphere with a pressure of 5.0 Pa, a bias voltage of −400 V was applied to the substrate, and a current of 40 A was caused to flow through a tungsten filament in the reaction vessel, whereby an ion bombardment process was carried out, with the Ar gas, on a surface of the substrate for 30 minutes. After the ion bombardment process, the reaction vessel was evacuated such that the pressure therein indicated a vacuum of $5.0 \times 10^{-3}$ Pa.

After the evacuation, the substrate was heated such that the temperature thereof reached the temperature in Table 3 (temperature when the step was started), a nitrogen ($N_2$) gas was introduced into the reaction vessel, and an adjustment was conducted to achieve a nitrogen gas atmosphere with a pressure of 2.7 Pa in the reaction vessel.

As to invention samples 1 to 7, the bias voltage shown in Table 3 was applied to the substrate without the formation of a lower layer, and the metal evaporation source was evaporated via an arc discharge with an arc current of 120 A, whereby particles of a hard layer were formed on the substrate surface (particle formation step). After the start of the particle formation, particles were formed while varying the temperature of the substrate to reach a low temperature at the cooling rate shown in Table 3.

After the particle formation step, as to invention samples 1 to 7, a hard layer was deposited under the conditions shown in Table 4 (deposition step). At this time, an adjustment was conducted so as to achieve a nitrogen gas atmosphere with a pressure of 2.7 Pa in the reaction vessel. Further, the arc current was adjusted to 120 A.

As to invention samples 8 to 15, a bias voltage of −50V was applied to the substrate, and the metal evaporation source shown in Table 1 was evaporated via an arc discharge with an arc current of 120 A, whereby a lower layer was formed.

Then, as to invention samples 8 to 15, the bias voltage shown in Table 3 was applied to the substrate, and the metal evaporation source was evaporated by the arc discharge shown in Table 3, whereby particles of a hard layer were formed on the substrate surface (particle formation step). After the start of the particle formation, particles were formed while varying the temperature of the substrate to reach a low temperature at the cooling rate shown in Table 3.

After the particle formation step, as to invention samples 8 to 15, a hard layer was deposited under the conditions shown in Table 4 (deposition step). At this time, an adjustment was conducted so as to achieve a nitrogen gas atmosphere with a pressure of 2.7 Pa in the reaction vessel. Further, the arc current was adjusted to 120 A.

As to comparative samples 1, 5 and 6, the metal evaporation source shown in Table 2 was evaporated with respect to the substrate so as to form each layer under the conditions shown in Table 5. At this time, an adjustment was conducted so as to achieve a nitrogen gas atmosphere with a pressure of 2.7 Pa in the reaction vessel. Further, the arc current was adjusted to 120 A.

As to comparative samples 3 and 4, the bias voltage shown in Table 3 was applied to the substrate, and the metal evaporation source was evaporated via an arc discharge with an arc current of 120 A, whereby particles of a first layer were formed on the substrate surface (particle formation step). After the start of the particle formation, particles were formed while varying the temperature of the substrate to reach a low temperature at the cooling rate shown in Table 3.

After the particle formation step, as to comparative samples 3 and 4, a first layer was deposited under the conditions shown in Table 4 (deposition step). As to comparative sample 2, a first layer was deposited under the conditions shown in Table 4 (deposition step) without the particle formation step. As to comparative sample 3, a hard layer was deposited at a certain temperature without cooling. At this time, an adjustment was conducted so as to achieve a nitrogen gas atmosphere with a pressure of 2.7 Pa in the reaction vessel. Further, the arc current was adjusted to 120 A.

As to comparative samples 7 and 8, a bias voltage of −50 V was applied to the substrate, and the metal evaporation source shown in Table 2 was evaporated via an arc discharge with an arc current of 120 A, whereby a first layer was formed.

Next, as to comparative samples 7 and 8, the bias voltage shown in Table 3 was applied to the substrate, and the metal evaporation source was evaporated via the arc discharge shown in Table 3, whereby particles of a second layer were formed on the substrate surface (particle formation step). After the start of the particle formation, particles were formed while varying the temperature of the substrate to reach a low temperature at the cooling rate shown in Table 3.

After the particle formation step, as to comparative samples 7 and 8, a second layer was deposited under the conditions shown in Table 4 (deposition step). At this time, an adjustment was conducted so as to achieve a nitrogen gas atmosphere with a pressure of 2.7 Pa in the reaction vessel. Further, the arc current was adjusted to 120 A.

After the formation of each layer with the predetermined average thickness shown in each of Tables 1 and 2 on the substrate surface, the heater was turned off, and the sample was taken out of the reaction vessel after the temperature of the sample reached 100° C. or less.

TABLE 1

| Sample No. | Coating layer | | | | | | Overall avg. thickness ($\mu$m) |
|---|---|---|---|---|---|---|---|
| | Lower layer | | Hard layer | | Upper layer | | |
| | Composition | Avg. thickness ($\mu$m) | Composition | Avg. thickness ($\mu$m) | Composition | Avg. thickness ($\mu$m) | |
| Invention sample 1 | — | — | $(Al_{0.60}Ti_{0.40})N$ | 2.0 | — | — | 2.0 |
| Invention sample 2 | — | — | $(Al_{0.65}Ti_{0.35})N$ | 2.0 | — | — | 2.0 |
| Invention sample 3 | — | — | $(Al_{0.65}Ti_{0.35})N$ | 4.0 | — | — | 4.0 |
| Invention sample 4 | — | — | $(Al_{0.70}Ti_{0.30})N$ | 4.0 | — | — | 4.0 |
| Invention sample 5 | — | — | $(Al_{0.70}Ti_{0.30})N$ | 8.0 | — | — | 8.0 |
| Invention sample 6 | — | — | $(Al_{0.70}Ti_{0.30})N$ | 10.0 | — | — | 10.0 |
| Invention sample 7 | — | — | $(Al_{0.83}Ti_{0.17})N$ | 4.0 | — | — | 4.0 |
| Invention sample 8 | $(Al_{0.70}Cr_{0.30})N$ | 0.5 | $(Al_{0.70}Ti_{0.30})N$ | 3.5 | — | — | 4.0 |
| Invention sample 9 | $(Ti_{0.70}Si_{0.30})N$ | 1.0 | $(Al_{0.70}Ti_{0.30})N$ | 3.0 | — | — | 4.0 |
| Invention sample 10 | $(Ti_{0.50}Al_{0.30}Nb_{0.20})N$ | 2.0 | $(Al_{0.70}Ti_{0.30})N$ | 2.0 | — | — | 4.0 |
| Invention sample 11 | $(Al_{0.45}Ti_{0.45}Y_{0.10})N$ | 3.0 | $(Al_{0.70}Ti_{0.30})N$ | 1.0 | — | — | 4.0 |
| Invention sample 12 | $(Ti_{0.55}Al_{0.35}W_{0.10})N$ | 0.5 | $(Al_{0.75}Ti_{0.25})N$ | 3.5 | — | — | 4.0 |
| Invention sample 13 | $(Ti_{0.70}Al_{0.30})N$ | 0.5 | $(Al_{0.70}Ti_{0.30})N$ | 3.0 | $(Ti_{0.80}Hf_{0.20})N$ | 0.5 | 4.0 |
| Invention sample 14 | $(Ti_{0.65}Mo_{0.35})N$ | 0.5 | $(Al_{0.70}Ti_{0.30})N$ | 3.0 | $(Al_{0.60}Cr_{0.30}V_{0.10})N$ | 0.5 | 4.0 |
| Invention sample 15 | $(Ti_{0.80}Zr_{0.20})N$ | 0.5 | $(Al_{0.75}Ti_{0.25})N$ | 3.0 | $(Ti_{0.60}Al_{0.30}Ta_{0.10})N$ | 0.5 | 4.0 |

*The "—" symbol in the "composition" or "average thickness" column indicates that a lower layer or an upper layer is not formed.

TABLE 2

| Sample No. | Coating layer | | | | | | |
|---|---|---|---|---|---|---|---|
| | First layer | | Second layer | | Third layer | | |
| | Composition | Avg. thickness ($\mu$m) | Composition | Avg. thickness ($\mu$m) | Composition | Avg. thickness ($\mu$m) | |
| comparative sample 1 | $(Al_{0.50}Ti_{0.50})N$ | 4.0 | — | — | — | — | 4.0 |
| comparative sample 2 | $(Al_{0.60}Ti_{0.40})N$ | 4.0 | — | — | — | — | 4.0 |
| comparative sample 3 | $(Al_{0.65}Ti_{0.35})N$ | 4.0 | — | — | — | — | 4.0 |
| comparative sample 4 | $(Al_{0.90}Ti_{0.10})N$ | 4.0 | — | — | — | — | 4.0 |
| comparative sample 5 | $(Al_{0.50}Ti_{0.50})N$ | 0.5 | $(Al_{0.70}Ti_{0.30})N$ | 3.5 | — | — | 4.0 |
| comparative sample 6 | $(Ti_{0.50}Al_{0.30}Nb_{0.20})N$ | 0.5 | $(Al_{0.50}Ti_{0.50})N$ | 3.5 | — | — | 4.0 |
| comparative sample 7 | $(Al_{0.50}Ti_{0.50})N$ | 0.5 | $(Al_{0.90}Ti_{0.10})N$ | 3.5 | — | — | 4.0 |
| comparative sample 8 | $(Al_{0.70}Cr_{0.30})N$ | 0.5 | $(Al_{0.90}Ti_{0.10})N$ | 3.0 | $(Al_{0.70}Cr_{0.30})N$ | 0.5 | 4.0 |

*The "—" symbol in the "composition" or "average thickness" column indicates that a lower layer or an upper layer is not formed.

TABLE 3

| Sample No. | Particle formation step | | |
|---|---|---|---|
| | Temperature as of start of step (° C.) | Cooling rate (° C./time) | Bias voltage (V) |
| Invention sample 1 | 700 | 150 | −40 |
| Invention sample 2 | 600 | 100 | −40 |
| Invention sample 3 | 600 | 100 | −40 |
| Invention sample 4 | 500 | 80 | −20 |
| Invention sample 5 | 500 | 80 | −20 |
| Invention sample 6 | 500 | 80 | −20 |
| Invention sample 7 | 500 | 80 | −40 |
| Invention sample 8 | 400 | 80 | −40 |
| Invention sample 9 | 500 | 100 | −40 |
| Invention sample 10 | 500 | 120 | −40 |
| Invention sample 11 | 500 | 120 | −60 |
| Invention sample 12 | 600 | 100 | −60 |
| Invention sample 13 | 600 | 100 | −80 |
| Invention sample 14 | 400 | 80 | −80 |
| Invention sample 15 | 700 | 120 | −40 |
| comparative sample 2 | No Particle Formation Step | | |
| comparative sample 3 | 500 | 50 | −40 |
| comparative sample 4 | 500 | 120 | −40 |
| comparative sample 7 | 500 | 120 | −40 |
| comparative sample 8 | 500 | 140 | −40 |

TABLE 4

| Sample No. | Deposition step | | |
|---|---|---|---|
| | Temperature as of start of step (° C.) | Cooling rate (° C./time) | Bias voltage (V) |
| Invention sample 1 | 700 | 50 | −140 |
| Invention sample 2 | 600 | 30 | −120 |
| Invention sample 3 | 600 | 50 | −120 |
| Invention sample 4 | 500 | 50 | −60 |
| Invention sample 5 | 500 | 30 | −60 |
| Invention sample 6 | 500 | 20 | −100 |
| Invention sample 7 | 500 | 50 | −60 |
| Invention sample 8 | 400 | 50 | −60 |
| Invention sample 9 | 500 | 50 | −80 |
| Invention sample 10 | 500 | 50 | −80 |
| Invention sample 11 | 500 | 50 | −100 |
| Invention sample 12 | 600 | 20 | −100 |
| Invention sample 13 | 600 | 30 | −100 |
| Invention sample 14 | 400 | 30 | −140 |
| Invention sample 15 | 700 | 50 | −60 |
| comparative sample 2 | 500 | 20 | −140 |
| comparative sample 3 | 500 | 0 | −100 |
| comparative sample 4 | 500 | 80 | −60 |
| comparative sample 7 | 500 | 80 | −60 |
| comparative sample 8 | 500 | 80 | −60 |

TABLE 5

| Sample No. | Temperature (° C.) | Bias voltage (V) |
|---|---|---|
| comparative sample 1 | 500 | −100 |
| comparative sample 5 | 500 | −60 |
| comparative sample 6 | 500 | −100 |

As to the average thickness of each layer of each of the obtained samples, such average thickness was obtained by: measuring the thickness of each layer via an SEM observation of each of the cross-sectional surfaces at three locations near the position 50 μm off from the edge of a surface facing the metal evaporation source of the coated cutting tool, toward the center of such surface; and calculating the average value (arithmetic mean) of the resulting measurements. The composition of each layer of the obtained sample was measured from the cross-sectional surface near the position at most 50 μm off from the edge of a surface facing the metal evaporation source of the coated cutting tool, toward the center of such surface, using an EDS. The measurement results are shown in Tables 1 and 2. It should be noted that the composition ratio of the metal elements of each layer in each of Tables 1 and 2 refers to an atomic ratio of each metal element relative to all the metal elements in the metal compound which constitutes each layer.

As to the obtained samples, an X-ray diffraction measurement by means of a 2θ/θ focusing optical system with Cu-Kα radiation was performed under the following conditions: an output: 50 kV, 250 mA; an incident-side solar slit: 5°; a divergence longitudinal slit: ⅔°; a divergence longitudinal limit slit: 5 mm; a scattering slit: ⅔°; a light-receiving side solar slit: 5°; a light-receiving slit: 0.3 mm; a BENT monochromator; a light-receiving monochrome slit: 0.8 mm; a sampling width: 0.01°, a scan speed: 4°/min, and a 2θ measurement range: 30-100°. As to the apparatus, an X-ray diffractometer, RINT TTR III (product name) manufactured by Rigaku Corporation was used. The peak intensity of each plane index was obtained from an X-ray diffraction pattern. TC (111) and TC (311) were obtained from the resulting peak intensity of each plane index. The results are shown in Table 6. It should be noted that, when the lower layer was formed so as to be closer to the substrate than the hard layer, each peak intensity was measured by thin-film X-ray diffraction method in order to avoid the influence of the lower layer. Further, when the upper layer was formed on the surface side (opposite side to the substrate) with respect to the hard layer, the upper layer was removed by a polishing process, and an X-ray diffraction measurement was then performed in order to avoid the influence of the upper layer. As to the comparative samples, TC (111) and TC (311) were obtained with regard to the (Al, Ti)N layer which had the greatest average thickness.

TABLE 6

| Sample No. | Hard layer TC (311) | Hard layer TC (111) |
|---|---|---|
| Invention sample 1 | 2.60 | 0.85 |
| Invention sample 2 | 2.82 | 0.87 |
| Invention sample 3 | 2.95 | 0.87 |
| Invention sample 4 | 3.21 | 1.10 |
| Invention sample 5 | 3.05 | 1.13 |
| Invention sample 6 | 3.23 | 1.10 |
| Invention sample 7 | 3.53 | 0.74 |
| Invention sample 8 | 3.32 | 1.02 |
| Invention sample 9 | 3.12 | 1.09 |
| Invention sample 10 | 3.20 | 0.95 |
| Invention sample 11 | 3.05 | 0.90 |
| Invention sample 12 | 2.85 | 0.86 |
| Invention sample 13 | 2.90 | 0.86 |
| Invention sample 14 | 3.14 | 1.20 |
| Invention sample 15 | 2.87 | 0.85 |
| comparative sample 1 | 0.83 | 1.94 |
| comparative sample 2 | 1.80 | 2.50 |
| comparative sample 3 | 2.29 | 0.89 |
| comparative sample 4 | 4.60 | 0.05 |
| comparative sample 5 | 1.97 | 1.10 |
| comparative sample 6 | 0.42 | 2.01 |
| comparative sample 7 | 4.36 | 0.04 |
| comparative sample 8 | 4.50 | 0.10 |

As to the obtained samples, the compressive stress of the hard layer was measured by a $\sin^2\varphi$ method using an X-ray diffractometer. Such compressive stress of the hard layer was obtained by: measuring the stresses at any ten points included in a portion involved in cutting; and obtaining the average value (arithmetic mean). As to the comparative samples, the compressive stress of the (Al, Ti)N layer which had the greatest average thickness was obtained. The results are shown in Table 7.

TABLE 7

| Sample No. | Hard layer Compressive stress (GPa) |
|---|---|
| Invention sample 1 | 5.5 |
| Invention sample 2 | 4.4 |
| Invention sample 3 | 4.5 |
| Invention sample 4 | 3.0 |
| Invention sample 5 | 3.3 |
| Invention sample 6 | 4.2 |
| Invention sample 7 | 3.6 |
| Invention sample 8 | 3.7 |
| Invention sample 9 | 4.1 |
| Invention sample 10 | 4.0 |
| Invention sample 11 | 4.2 |
| Invention sample 12 | 4.0 |
| Invention sample 13 | 3.9 |
| Invention sample 14 | 4.8 |
| Invention sample 15 | 3.5 |
| comparative sample 1 | 7.0 |
| comparative sample 2 | 7.1 |
| comparative sample 3 | 4.0 |
| comparative sample 4 | 1.0 |
| comparative sample 5 | 3.0 |
| comparative sample 6 | 7.0 |
| comparative sample 7 | 1.5 |
| comparative sample 8 | 1.5 |

The following cutting test was conducted using the obtained samples.

[Cutting Test]

Workpiece: Inconel 718

Workpiece shape: a cylinder of φ150 mm×300 mm

Cutting rate: 70 m/min

Feed: 0.2 mm/rev

Depth of cut: 1.0 mm

Coolant: used

Evaluation items: a time when a sample was fractured (chipping occurred in the cutting edge of a sample) or had a flank wear width of 0.3 mm was defined as the end of the tool life, and the machining time to reach the end of the tool life was measured The results of the cutting test are shown in Table 8.

TABLE 8

| Sample No. | Cutting test Machining time (min.) |
|---|---|
| Invention sample 1 | 17 |
| Invention sample 2 | 19 |
| Invention sample 3 | 22 |
| Invention sample 4 | 30 |
| Invention sample 5 | 27 |
| Invention sample 6 | 22 |
| Invention sample 7 | 16 |
| Invention sample 8 | 36 |
| Invention sample 9 | 33 |
| Invention sample 10 | 28 |
| Invention sample 11 | 24 |
| Invention sample 12 | 31 |
| Invention sample 13 | 32 |
| Invention sample 14 | 30 |
| Invention sample 15 | 34 |
| comparative sample 1 | 7 |
| comparative sample 2 | 11 |
| comparative sample 3 | 13 |
| comparative sample 4 | 7 |
| comparative sample 5 | 14 |
| comparative sample 6 | 6 |
| comparative sample 7 | 8 |
| comparative sample 8 | 8 |

Comparative samples 1 and 6 each involve a shorter machining time to reach the occurrence of fractures because the progress of oxidation reduced the mechanical strength of the edge. Comparative samples 4, 7 and 8 each involve a large flank wear width in an early stage due to a high existence ratio of hexagonal crystals. Comparative samples 2, 3 and 5 each involve a shorter tool life than that involved in each invention sample because the TC (311) value is low and the mechanical strength is therefore low, compared with the invention sample.

The results of Table 8 indicate that the machining time of each invention sample is longer than the machining time of each comparative sample. Therefore, it is apparent that the invention samples each involve a longer tool life, and this can be considered to derive from the excellent oxidation resistance and mechanical strength seen in the invention samples.

The present application is based on the Japanese patent application filed on Mar. 27, 2015 (JP Appl. 2015-066976), the content of which is incorporated herein by reference.

INDUSTRIAL APPLICABILITY

As to a coated cutting tool according to the present invention, since the tool life can be extended more than that involved in the prior art, such coated cutting tool has high industrial applicability.

What is claimed is:

1. A coated cutting tool comprising a substrate and a coating layer formed on a surface of the substrate, wherein:
at least one layer of the coating layer comprises a predetermined layer containing a compound having a composition represented by the formula:

$(Al_xTi_{1-x})N$ wherein x denotes an atomic ratio of the Al element based on a total of the Al element and the Ti element, and x satisfies $0.60 \leq x \leq 0.85$;
a value of an orientation index TC (311) of a cubic (311) plane of the predetermined layer is from 2.5 or more to 4.2 or less; and
an average thickness of the predetermined layer is from 2.0 μm or more to 12.0 μm or less.

2. The coated cutting tool according to claim 1, wherein a value of an orientation index TC (111) of a cubic (111) plane of the predetermined layer is from 0.85 or more to 1.5 or less.

3. The coated cutting tool according to claim 1, wherein the predetermined layer has a compressive stress of 0.2 GPa or higher to 6.0 GPa or lower.

4. The coated cutting tool according to claim 1, wherein:
the coating layer comprises, between the predetermined layer and the substrate, a lower layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the lower layer having a composition different from that of the predetermined layer; and
an average thickness of the lower layer is from 0.1 μm or more to 3.5 μm or less.

5. The coated cutting tool according to claim 1, wherein:
the coating layer comprises, on a side of the predetermined layer which is opposite to the substrate, an upper layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the upper layer having a composition different from that of the predetermined layer; and
an average thickness of the upper layer is from 0.1 μm or more to 3.5 μm or less.

6. The coated cutting tool according to claim 1, wherein an average thickness of the coating layer in its entirety is from 1.0 μm or more to 15.0 μm or less.

7. The coated cutting tool according to claim 1, wherein the coating layer is formed by a physical vapor deposition method.

8. The coated cutting tool according to claim 1, wherein the substrate is comprised of a cemented carbide, cermet, ceramics or a sintered body containing cubic boron nitride.

9. The coated cutting tool according to claim 2, wherein the predetermined layer has a compressive stress of 0.2 GPa or higher to 6.0 GPa or lower.

10. The coated cutting tool according to claim 2, wherein:
the coating layer comprises, between the predetermined layer and the substrate, a lower layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the lower layer having a composition different from that of the predetermined layer; and an average thickness of the lower layer is from 0.1 μm or more to 3.5 μm or less.

11. The coated cutting tool according to claim 3, wherein:
the coating layer comprises, between the predetermined layer and the substrate, a lower layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the lower layer having a composition different from that of the predetermined layer; and an average thickness of the lower layer is from 0.1 μm or more to 3.5 μm or less.

12. The coated cutting tool according to claim 9, wherein:
the coating layer comprises, between the predetermined layer and the substrate, a lower layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the lower layer having a composition different from that of the predetermined layer; and an average thickness of the lower layer is from 0.1 μm or more to 3.5 μm or less.

13. The coated cutting tool according to claim 2, wherein:
the coating layer comprises, on a side of the predetermined layer which is opposite to the substrate, an upper layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the upper layer having a composition different from that of the predetermined layer; and an average thickness of the upper layer is from 0.1 μm or more to 3.5 μm or less.

14. The coated cutting tool according to claim 3, wherein:
the coating layer comprises, on a side of the predetermined layer which is opposite to the substrate, an upper layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the upper layer having a composition different from that of the predetermined layer; and an average thickness of the upper layer is from 0.1 μm or more to 3.5 μm or less.

15. The coated cutting tool according to claim 9, wherein:
the coating layer comprises, on a side of the predetermined layer which is opposite to the substrate, an upper layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the upper layer having a composition different from that of the predetermined layer; and an average thickness of the upper layer is from 0.1 μm or more to 3.5 μm or less.

16. The coated cutting tool according to claim 4, wherein:
the coating layer comprises, on a side of the predetermined layer which is opposite to the substrate, an upper layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the upper layer having a composition different from that of the predetermined layer; and an average thickness of the upper layer is from 0.1 μm or more to 3.5 μm or less.

17. The coated cutting tool according to claim 10, wherein:
the coating layer comprises, on a side of the predetermined layer which is opposite to the substrate, an upper layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the upper layer having a composition different from that of the predetermined layer; and an average thickness of the upper layer is from 0.1 μm or more to 3.5 μm or less.

18. The coated cutting tool according to claim 11, wherein:
the coating layer comprises, on a side of the predetermined layer which is opposite to the substrate, an upper layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the upper layer having a composition different from that of the predetermined layer; and an average thickness of the upper layer is from 0.1 μm or more to 3.5 μm or less.

19. The coated cutting tool according to claim 12, wherein:
the coating layer comprises, on a side of the predetermined layer which is opposite to the substrate, an upper layer containing a compound of: an element of at least one kind selected from the group consisting of Ti, Zr, Hf, V, Nb, Ta, Cr, Mo, W, Al, Si and Y; and an element of at least one kind selected from the group consisting of C, N, O and B, the upper layer having a composition different from that of the predetermined layer; and an average thickness of the upper layer is from 0.1 μm or more to 3.5 μm or less.

20. The coated cutting tool according to claim 2, wherein an average thickness of the coating layer in its entirety is from 2.0 μm or more to 15.0 μm or less.

* * * * *